United States Patent
Joe et al.

(10) Patent No.: US 8,012,859 B1
(45) Date of Patent: Sep. 6, 2011

(54) ATOMIC LAYER DEPOSITION OF SILICON AND SILICON-CONTAINING FILMS

(75) Inventors: Raymond Joe, Boise, ID (US);
Meenakshisundaram Gandhi, Austin, IN (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/751,774

(22) Filed: Mar. 31, 2010

(51) Int. Cl.
*H01L 21/20* (2006.01)

(52) U.S. Cl. ......... 438/478; 438/488; 438/503; 438/507

(58) Field of Classification Search .................. None
See application file for complete search history.

(56) References Cited

U.S. PATENT DOCUMENTS

| | | | |
|---|---|---|---|
| 5,225,366 A * | 7/1993 | Yoder | 117/90 |
| 6,586,349 B1 * | 7/2003 | Jeon et al. | 438/785 |
| 7,132,338 B2 | 11/2006 | Samoilov et al. | |
| 7,419,888 B2 | 9/2008 | Yang et al. | |
| 7,540,920 B2 * | 6/2009 | Singh et al. | 117/105 |
| 7,651,729 B2 * | 1/2010 | Kim et al. | 427/248.1 |
| 2003/0168001 A1 * | 9/2003 | Sneh | 117/86 |
| 2003/0190423 A1 | 10/2003 | Yang et al. | |
| 2004/0221798 A1 | 11/2004 | Sherman | |
| 2005/0042865 A1 * | 2/2005 | Cabral et al. | 438/680 |
| 2006/0003557 A1 * | 1/2006 | Cabral et al. | 438/485 |
| 2006/0090694 A1 * | 5/2006 | Cho et al. | 117/104 |
| 2006/0216418 A1 * | 9/2006 | Matsuura | 427/248.1 |
| 2006/0216928 A1 * | 9/2006 | Chung et al. | 438/630 |
| 2007/0292974 A1 * | 12/2007 | Mizuno et al. | 438/5 |
| 2008/0044569 A1 | 2/2008 | Myo et al. | |
| 2008/0072819 A1 * | 3/2008 | Rahtu et al. | 117/104 |
| 2008/0116523 A1 | 5/2008 | Li | |
| 2008/0241358 A1 | 10/2008 | Joe et al. | |
| 2008/0315293 A1 | 12/2008 | Ji et al. | |
| 2009/0011578 A1 | 1/2009 | Samoilov et al. | |
| 2009/0214767 A1 * | 8/2009 | Wang et al. | 427/126.1 |
| 2009/0280639 A1 | 11/2009 | Blalock | |

OTHER PUBLICATIONS

Copel, M. et al. "Influence of surfactants in Ge and Si epitaxi on Si(001)", Phys. Rev. B, vol. 42, No. 18, 1990, pp. 11682-11689.
Gates, S.M. "Comparison of Chemical Schemes for Si Atomic Layer Epitaxy", J. Phys. Chem., vol. 96, No. 25, 1992, pp. 10439-10443.
Gates, S.M. et al. "Epitaxial Si films on Ge(100) grown via H/Cl exchange", Appl. Phys. Lett., vol. 62, No. 5, 1993, pp. 510-512.
Koleske, D.D. et al. "Precursors for Si atomic layer epitaxy: Real time adsorption studies on Si(100)", Appl. Phys. Lett., vol. 61, No. 15, 1982, pp. 1802-1804.

(Continued)

*Primary Examiner* — Scott B Geyer

(57) ABSTRACT

A method is provided for depositing silicon and silicon-containing films by atomic layer deposition (ALD). The method includes disposing the substrate in a batch processing system configured for performing ALD of the silicon-containing film, exposing the substrate to a non-saturating amount of a first precursor containing silicon, and evacuating or purging the first precursor from the batch processing system. The method further includes exposing the substrate to a saturating amount of a second precursor containing silicon or a dopant, where only one of the first and second precursors contain a halogen, and a reaction of the first and second precursors on the substrate forms a silicon or silicon-containing film and a volatile hydrogen-halogen (HX) by-product, evacuating or purging the second precursor and the HX by-product from the batch processing system, and repeating the exposing and evacuation or purging steps until the silicon or silicon-containing film has a desired thickness.

26 Claims, 5 Drawing Sheets

OTHER PUBLICATIONS

Koleske, D.D. et al. "Growth of Si on Si(100) via H/Cl exchange and the effect of interfacial boron", J. Appl. Phys., vol. 72, No. 9, 1992, pp. 4073-4082.

Koleske, D.D. et al. "Atomic layer epitaxy of Si on Ge(100) using $Si_2Cl_6$ and atomic hydrogen", Appl. Phys. Lett., vol. 64, No. 7, 1994, pp. 884-886.

Koleske, D.D. et al. "Atomic layer epitaxy of Si on Ge(100): Direct recoiling studies of film morphology", J. Appl. Phys., vol. 73, No. 6, 1994, pp. 1615-1621.

Nishizawa, J. et al. "Silicon Molecular Layer Epitaxy", J. Electrochem. Soc. vol. 137, No. 6, 1990, pp. 1898-1904.

Yokoyama, S. et al. "Self-limiting atomic layer deposition of Si on $SiO_2$ by alternate supply and $Si_2H_6$ and $SiCl_4$", Appl. Phys. Lett., vol. 79, No. 5, 2001, pp. 617-619.

Tsu, R. et al., "$Si_2H_6$ adsorption and dissociation pathways on Ge(001)2x1: mechanisms for heterogeneous atomic layer epitaxy", Thin Solid Films, vol. 225 (1993) pp. 191-195.

Grutzmacher, D.A. et al. "Atomic layer doping for Si", Thin Solid Films, vol. 225 (1993) pp. 163-167.

Imai, S. et al., "Atomic layer epitaxy of Si using atomic H", Thin Solid Films, vol. 225 (1993) pp. 168-172.

McIntosh, F.G. et al., "Silicon monolayer growth using dichlorosilane and hydrogen in a near atmospheric pressure chemical vapor deposition", Thin Solid Films, vol. 225 (1993) pp. 183-186.

Nishizawa, J. et al., "Molecular Layer Epitaxy of Silicon", J. Crystal Growth, vol. 99 (1990) pp. 502-505.

Lubben, D. et al., "Mechanisms and kinetics of Si atomic-layer epitaxy on Si(002)2×1 from $Si_2H_6$", J. Vac. Sci. Technol. A 9(6), Nov./Dec. 1991, pp. 3003-3011.

Fabreguette, F.H. et al., "Quartz crystal microbalance study of tungsten atomic layer deposition using $WF_6$ and $Si_2H_6$", Thin Solid Films, vol. 488 (2005) pp. 103-110.

Kim, S-H. et al., "Effects of $B_2H_6$ Pretreatment on ALD of W Film Using a Sequential Supply of $WF_6$ and $SiH_4$", Electrochemical and Solid-State Letters, vol. 8, No. 10 (2005) pp. C155-C159.

Kim, S-H. et al., "A Comparative Study of the Atomic-Layer-Deposited Tungsten Thin Films as Nucleation Layers for W-Plug Deposition", Journal of the Electrochemical Society, vol. 153, No. 10 (2006) pp. G887-G893.

Lemonds, A.M. et al., "Atomic layer deposition of $TaSi_x$ thin films on $SiO_2$ using $TaF_5$ and $Si_2H_6$", Thin Solid Films, vol. 488 (2005) pp. 9-14.

United States Patent and Trademark Office, International Search Report and Written Opinion for corresponding International application No. PCT/US11/30116, mailed May 31, 2011, 11 pp.

* cited by examiner

ATOMIC LAYER DEPOSITION OF SILICON AND SILICON-CONTAINING FILMS

FIELD OF THE INVENTION

The present invention relates to semiconductor processing, and more particularly, to forming silicon and silicon-containing films on a substrate.

BACKGROUND OF THE INVENTION

Silicon and silicon-containing films are used for a wide variety of applications in the semiconductor industry. Silicon films include polycrystalline silicon (poly-Si) and epitaxial silicon, and silicon-containing film include silicon germanium (SiGe), silicon germanium carbide (SiGeC), silicon carbide (SiC), and silicon nitride (SiN). As circuit geometries shrink to ever smaller feature sizes, lower deposition temperatures are preferred, for example because of introduction of new materials into semiconductor devices and reduction of thermal budgets of shallow implants in source and drain regions. Moreover, it is evident that non-selective (blanket) and selective deposition of silicon-containing films will be needed for future devices. For example, semiconductor fabrication requires tight specification limits on thickness and resistivity for epitaxial silicon films. Epitaxial silicon deposition can be a first step in a process flow where the crystal lattice of the bulk silicon is extended through growth of a new silicon-containing layer that may have a different doping level than the bulk. Matching target epitaxial film thickness and resistivity parameters is important for the subsequent fabrication of properly functioning devices.

One example of the use of selective deposition of epitaxial silicon-containing films is for manufacturing silicon-on-insulator (SOI) devices with raised source and drains. During SOI device fabrication, processing may consume an entire silicon film in source and drain regions, thereby requiring extra silicon in these regions that can be provided by selective epitaxial growth (SEG) of silicon-containing films. Selective epitaxial deposition of silicon-containing films can reduce the number of photolithography and etching steps that are needed, which can reduce the overall cost and complexity involved in manufacturing a device. Despite the preference for lower temperature deposition processes, thermal deposition of epitaxial silicon using the traditional silane ($SiH_4$) and dichlorosilane (DCS, $SiCl_2H_2$) source gases generally require high deposition temperatures (e.g., greater than about 850-900° C.) to achieve deposition rates that are high enough for the process to be incorporated into processes for manufacturing of devices.

Future device generations will require new methods with low thermal budgets for depositing silicon and silicon-containing films with improved materials and electrical properties, for example thinner films without pinhole defects.

SUMMARY OF THE INVENTION

A method is provided for depositing silicon and silicon-containing films on a substrate by atomic layer deposition (ALD). Examples of the silicon-containing films include doped silicon films.

According to one embodiment, a method is provided for depositing a silicon or silicon-containing film. The method includes disposing the substrate in a batch processing system configured for performing ALD of the silicon or silicon-containing film, exposing the substrate to a non-saturating amount of a first precursor containing silicon, evacuating or purging the first precursor from the batch processing system. The method further includes exposing the substrate to a saturating amount of a second precursor containing silicon or a dopant, where only one of the first and second precursors contain a halogen, and a reaction of the first and second precursors on the substrate forms the silicon or silicon-containing film and a volatile hydrogen-halogen (HX) by-product, evacuating or purging the second precursor and the hydrogen-halogen (HX) by-product from the batch processing system, and repeating the exposing and evacuation or purging steps until the silicon or silicon-containing film has a desired thickness.

According to another embodiment, a method is provided for depositing a silicon film. The method includes disposing the substrate in a batch processing system configured for performing ALD of the silicon film, exposing the substrate to a non-saturating amount of a first silicon precursor, evacuating or purging the first silicon precursor from the batch processing system. The method further includes exposing the substrate to a saturating amount of a second silicon precursor, where only one of the first and second silicon precursors contains a halogen, and a reaction of the first and second silicon precursors on the substrate forms the silicon film and a volatile hydrogen-halogen (HX) by-product, evacuating or purging the second silicon precursor and the HX by-product from the batch processing system, an repeating the exposing and evacuation or purging steps until the silicon film has a desired thickness.

According to yet another embodiment, a method is provided for depositing a doped silicon film. The method includes disposing the substrate in a batch processing system configured for performing ALD of the doped silicon film, exposing the substrate to a non-saturating amount of a first precursor containing silicon, evacuating or purging the first precursor from the batch processing system. The method further includes exposing the substrate to a saturating amount of a second precursor containing a dopant, where only one of the first and second precursors contains a halogen, and a reaction of the first and second precursors on the substrate forms the doped silicon film and a volatile HX by-product, evacuating or purging the second precursor and the HX by-product from the batch processing system, an repeating the exposing and evacuation or purging steps until the doped silicon film has a desired thickness.

According to one embodiment, a method is provided for depositing a silicon or silicon-containing film. The method includes disposing the substrate in a batch processing system configured for performing ALD of the silicon or silicon-containing film, exposing the substrate to a saturating amount of a first precursor containing silicon, evacuating or purging the first precursor from the batch processing system. The method further includes exposing the substrate to a saturating amount of a second precursor containing silicon or a dopant, where only one of the first and second precursors contain a halogen, and a reaction of the first and second precursors on the substrate forms the silicon or silicon-containing film and a volatile hydrogen-halogen (HX) by-product, evacuating or purging the second precursor and the hydrogen-halogen (HX) by-product from the batch processing system, repeating the exposing and evacuation or purging steps until the silicon or silicon-containing film has a desired thickness, and periodically treating the silicon-containing film with a cleaning gas prior to the repeating.

DETAILED DESCRIPTION OF SEVERAL EMBODIMENTS OF THE INVENTION

Embodiments of the invention describe methods for depositing silicon and silicon-containing film on a substrate by ALD.

In the following description, in order to facilitate a thorough understanding of the invention and for purposes of explanation and not limitation, specific details are set forth, such as a particular geometry of the batch processing system and descriptions of various components. However, it should be understood that the invention may be practiced in other embodiments that depart from these specific details.

Figure 1:
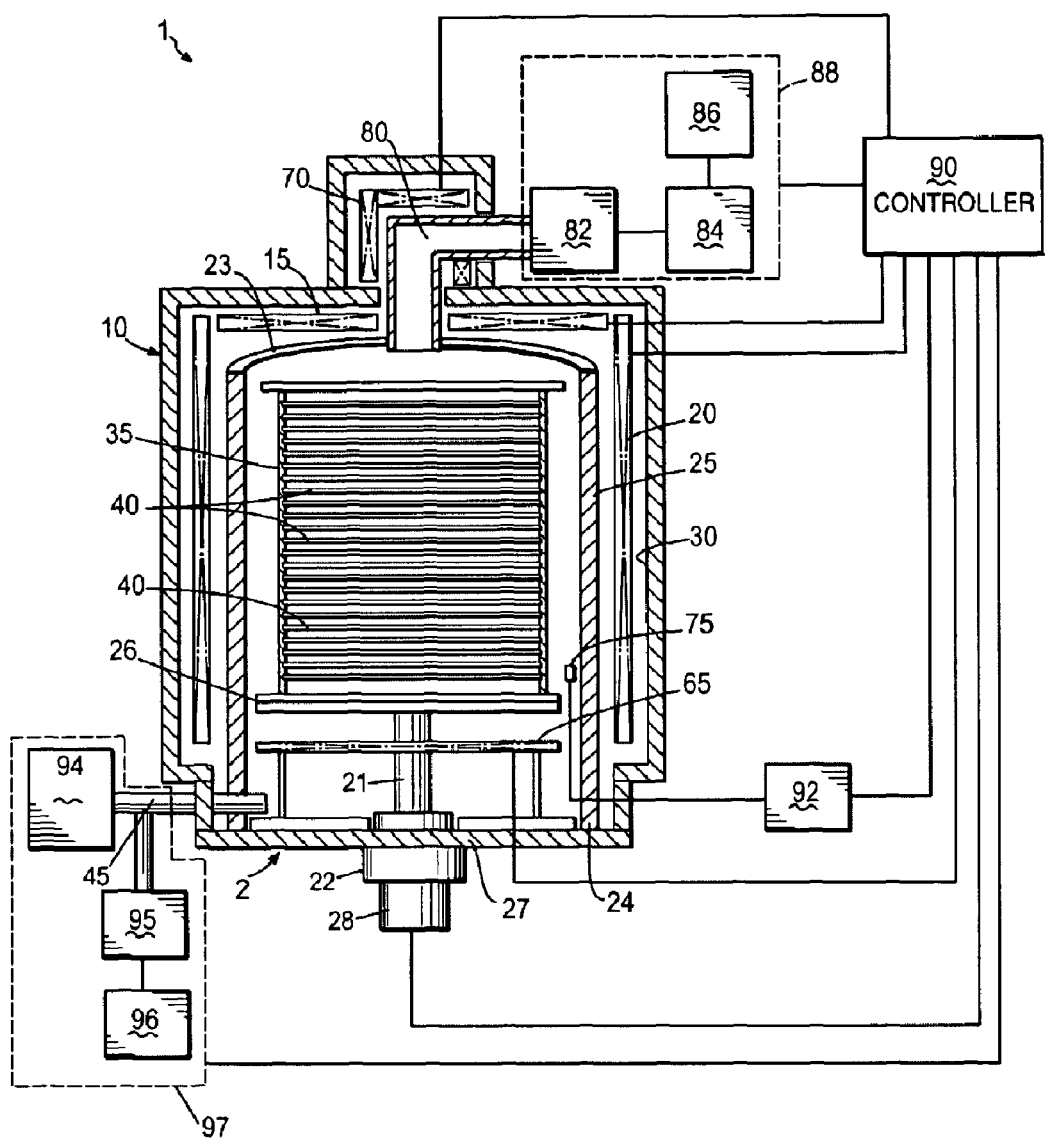
FIG. 1 shows a simplified block diagram of a batch processing system according to an embodiment of the invention.

Referring now to the drawings, FIG. 1 shows a simplified block diagram of a batch processing system according to an embodiment of the invention. The batch processing system 1 contains a process chamber 10 and a process tube 25 that has an upper end 23 connected to an exhaust pipe 80, and a lower end 24 hermetically joined to a lid 27 of cylindrical manifold 2. The exhaust pipe 80 discharges gases from the process tube 25 to a vacuum pumping system 88 to maintain a pre-determined atmospheric or below atmospheric pressure in the batch processing system 1. A substrate holder 35 for holding a plurality of substrates (wafers) 40 in a tier-like manner (in respective horizontal planes at vertical intervals) is placed in the process tube 25. The substrate holder 35 resides on a turntable 26 that is mounted on a rotating shaft 21 penetrating the lid 27 and driven by a motor 28. The turntable 26 can be rotated during processing to improve overall film uniformity or, alternately, the turntable can be stationary during processing. The lid 27 is mounted on an elevator 22 for transferring the substrate holder 35 in and out of the process tube 25. When the lid 27 is positioned at its uppermost position, the lid 27 is adapted to close the open end of the manifold 2.

A gas delivery system 97 is configured for introducing gases into the process chamber 10. A plurality of gas supply lines can be arranged around the manifold 2 to supply a plurality of gases into the process tube 25 through the gas supply lines. In FIG. 1, only one gas supply line 45 among the plurality of gas supply lines is shown. The gas supply line 45 is connected to a first gas source 94. In general, the first gas source 94 can supply gases for processing the substrates 40, including gases for forming films (e.g., silicon-containing gases and dopants for depositing silicon and silicon-containing films) onto the substrates 40.

In addition, or in the alternate, one or more of the gases can be supplied from the (remote) plasma source 95 that is operatively coupled to a second gas source 96 and to the process chamber 10 by the gas supply line 45. The plasma-excited gas is introduced into the process tube 25 by the gas supply line 45. The plasma source 95 can, for example, be a microwave plasma source, a radio frequency (RF) plasma source, or a plasma source powered by light radiation. In the case of a microwave plasma source, the microwave power can be between about 500 Watts (W) and about 5,000 W. The microwave frequency can, for example, be 2.45 GHz or 8.3 GHz. In one example, the remote plasma source can be a Downstream Plasma Source Type AX7610, manufactured by MKS Instruments, Wilmington, Mass., USA.

A cylindrical heat reflector 30 is disposed so as to cover the reaction tube 25. The heat reflector 30 has a mirror-finished inner surface to suppress dissipation of radiation heat radiated by main heater 20, bottom heater 65, top heater 15, and exhaust pipe heater 70. A helical cooling water passage (not shown) can be formed in the wall of the process chamber 10 as a cooling medium passage. The heaters 20, 65, and 15 can, for example, maintain the temperature of the substrates 40 between about 20° C. and about 900° C.

The vacuum pumping system 88 comprises a vacuum pump 86, a trap 84, and automatic pressure controller (APC) 82. The vacuum pump 86 can, for example, include a dry vacuum pump capable of a pumping speed up to 20,000 liters per second (and greater). During processing, gases can be introduced into the process chamber 10 via the gas supply line 45 of the gas delivery system 97 and the process pressure can be adjusted by the APC 82. The trap 84 can collect unreacted precursor material and by-products from the process chamber 10.

The process monitoring system 92 comprises a sensor 75 capable of real-time process monitoring and can, for example, include a mass spectrometer (MS), a FTIR spectrometer, or a particle counter. A controller 90 includes a microprocessor, a memory, and a digital I/O port capable of generating control voltages sufficient to communicate and activate inputs to the batch processing system as well as monitor outputs from the batch processing system 1. Moreover, the controller 90 is coupled to and can exchange information with gas delivery system 97, motor 28, process monitoring system 92, heaters 20, 15, 65, and 70, and vacuum pumping system 88. The controller 90 may be implemented as a DELL PRECISION WORKSTATION 610™. The controller 90 may also be implemented as a general purpose computer, processor, digital signal processor, etc., which causes a substrate processing apparatus to perform a portion or all of the processing steps of the invention in response to the controller 90 executing one or more sequences of one or more instructions contained in a computer readable medium. The computer readable medium or memory for holding instructions programmed according to the teachings of the invention and for containing data structures, tables, records, or other data described herein. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

The controller 90 may be locally located relative to the batch processing system 1, or it may be remotely located relative to the batch processing system 1 via an internet or intranet. Thus, the controller 90 can exchange data with the batch processing system 1 using at least one of a direct connection, an intranet, and the internet. The controller 90 may be coupled to an intranet at a customer site (i.e., a device maker, etc.), or coupled to an intranet at a vendor site (i.e., an equipment manufacturer). Furthermore, another computer (i.e., controller, server, etc.) can access controller 90 to exchange data via at least one of a direct connection, an intranet, and the internet.

It is to be understood that the batch processing system 1 depicted in FIG. 1 is shown for exemplary purposes only, as many variations of the specific hardware can be used to practice the present invention, and these variations will be readily apparent to one having ordinary skill in the art. The batch processing system 1 in FIG. 1 can, for example, process substrates of any size, such as 200 mm substrates, 300 mm substrates, or even larger substrates. Furthermore, the batch processing system 1 can simultaneously process up to about 200 substrates, or more. Alternately, the batch processing system 1 can simultaneously process up to about 25 substrates.

Figure 2:
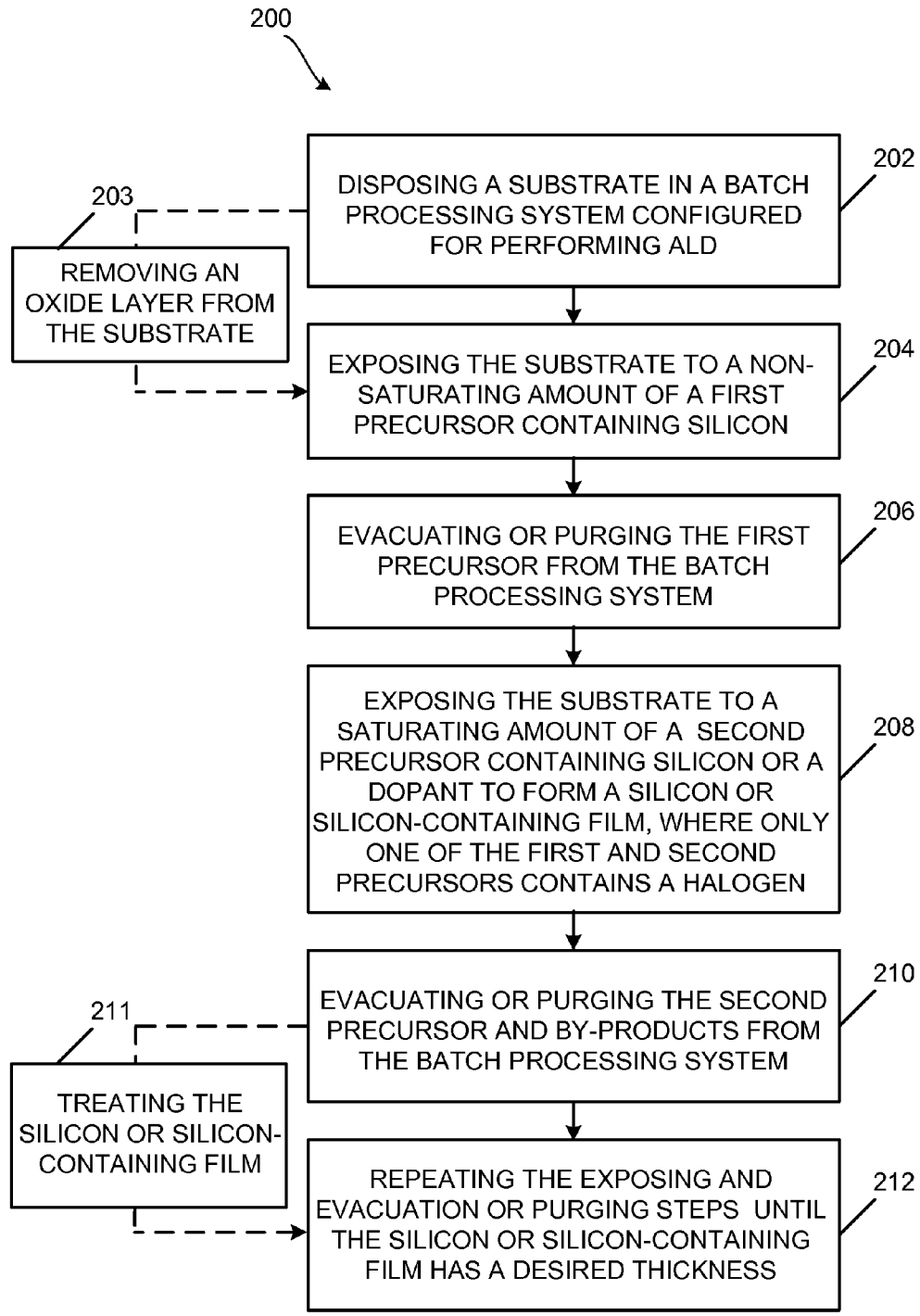
FIG. 2 is a flow diagram for forming a silicon-containing film on a substrate by ALD according to an embodiment of the invention.

Referring now to FIGS. 2 and 5A-5F, FIG. 2 is a flow diagram for forming a silicon or silicon-containing film on a substrate by ALD according to an embodiment of the invention, and FIGS. 5A-5F schematically illustrate deposition of a silicon or silicon-containing film on a substrate according to embodiments of the invention. In FIG. 2, the process 200 starts at 202. At 202, a substrate 500 is provided in a process chamber of a batch processing system. The process chamber can, for example, be the process chamber 10 of the batch processing system 1 depicted in FIG. 1. The substrate 500 can, for example, contain Si, SiGe, SiGeC, SiC, SiN, SiCN, SiCO, Ge, can be a glass substrate, a LCD substrate, or a compound semiconductor substrate, and can include numerous active devices and/or isolation regions. Furthermore, the substrate 500 can be a patterned substrate and contain vias or trenches or combinations thereof.

Figure 5A:
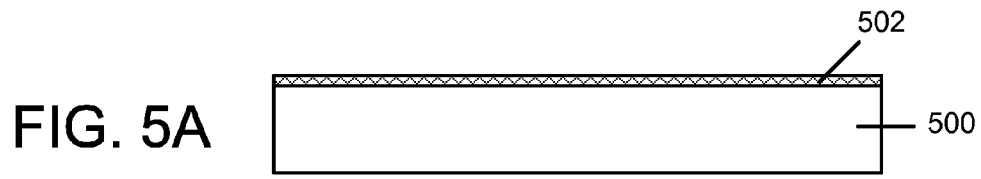
FIGS. 5A-5F schematically illustrate deposition of a silicon or silicon-containing film on a substrate according to embodiments of the invention.
Figure 5B:
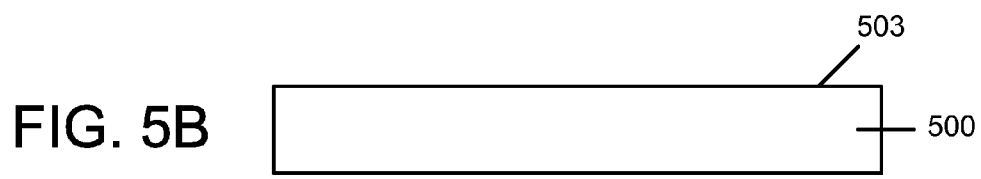
Figure 5C:
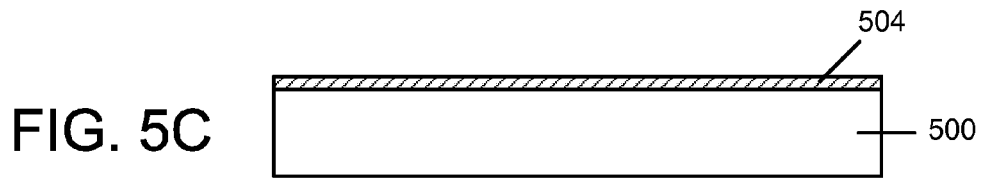
Figure 5D:
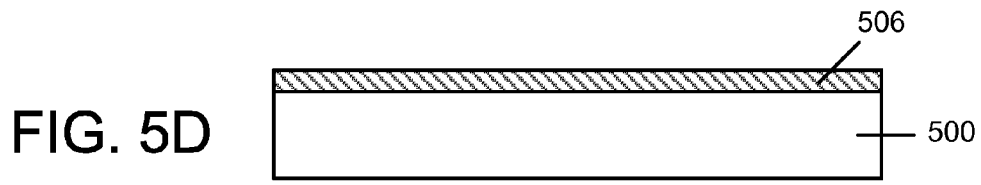
Figure 5E:
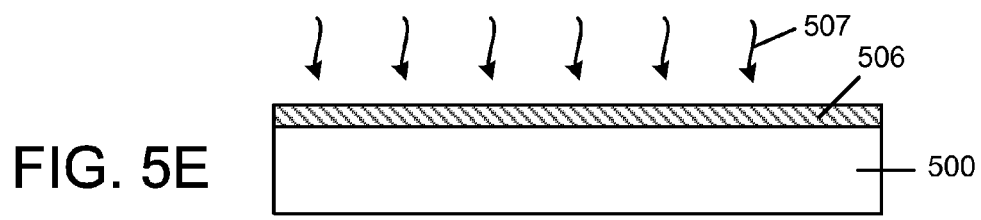
Figure 5F:
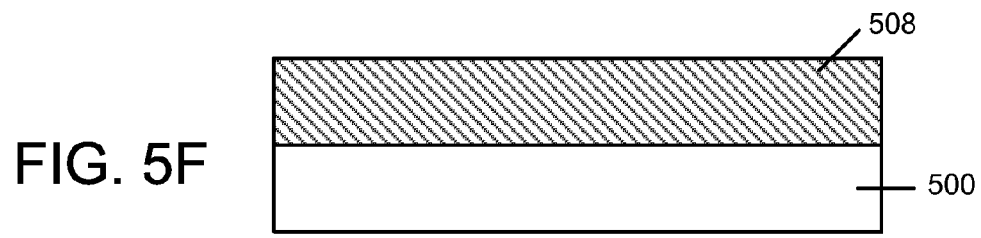

As depicted in FIG. 5A, the substrate 500 may contain an oxide layer 502 formed thereon. The oxide layer 502 can be removed from the substrate 500 at 203 prior to depositing the silicon or silicon-containing film. Removal of the oxide layer 502, and any other surface contamination, creates a clean substrate surface 503 shown in FIG. 5B that enables subsequent deposition of an epitaxial silicon or silicon-containing film such as Si or SiGe films on the substrate surface 503 where the crystal lattice of the bulk substrate 500 is extended through growth of the new silicon or silicon-containing film. The oxide layer 502 may be a native oxide layer that forms easily on silicon substrates when exposed to air, even at room temperature. In addition to inhibiting proper film seeding and epitaxial film growth, the presence of an oxide layer can also reduce deposition selectivity on different substrate materials. Alternately, an oxide removal step may be omitted, for example, if the substrate 500 is clean when provided in the process chamber or if deposition of an epitaxial film is not desired. Exemplary methods and systems for removing an oxide layer 502 from a substrate 500 are described in U.S. Pat. No. 7,501,349 and United States Patent Application Publication No. 2007/0039924. The entire contents of both these patent documents is hereby incorporated herein by reference. In one example, the oxide layer removal process and subsequent deposition of a silicon-containing film by ALD may be performed in the same process chamber to minimize oxidation of the substrate 500 between the processes.

Following the optional oxide layer removal process, the substrate 500 may be heated to a temperature in a temperature range that allows for ALD of silicon and silicon-containing films. ALD processing is performed under processing conditions where the process is self-limiting. In one example, a non-saturating amount of a first precursor containing silicon is adsorbed on a substrate surface and, thereafter, a saturating amount of a second precursor containing silicon or a dopant is exposed to the substrate containing the adsorbed layer of the first precursor. Due to the self-limiting properties of the adsorption process, the deposition automatically stops after the second exposure. This self limiting property can provide precise control of film thickness, which may be beneficial. The temperature of the substrate 500 can be between 25° C. and 650° C., or between 200° C. and 450° C. Those skilled in the art will appreciate that different silicon precursor can have different temperature ranges for ALD processing. The gas pressure in the process chamber can be between 0.1 Torr and 100 Torr, for example, and gas flows into the process chamber can be between 1 sccm and 10,000 sccm, or between 10 sccm and 1000 sccm.

At 204, substrate 500 is exposed to a non-saturating amount of a first precursor containing silicon. The exposure can be carried out for a time period that forms a non-saturated layer 504 of the first precursor or fragments of the first precursor on the substrate 500. The non-saturating exposure can be less than 90, 80, 70, 60, 50, 40, 30, 20, or even than 10% of a saturating exposure of the first precursor containing silicon.

At 206, following the exposure to the first precursor containing silicon, the first precursor is evacuated or purged from the batch processing system. The purging may use an inert gas such as $N_2$ or a noble gas.

At 208, the substrate 500 is exposed to a saturating amount of a second precursor containing silicon or a dopant to form silicon or silicon-containing film 506. The exposure to the second precursor saturates the non-saturated layer 504 and forms the silicon or silicon-containing film 506. In some examples, the silicon or silicon-containing film 506 may further contain fragments of the second precursor. For example, if the second precursor includes $SiH_4$, the fragments may contain $SiH_x$, where x<4. According to embodiments of the invention, the deposition of a silicon or silicon-containing film 506 at low temperature by ALD is enabled by formation of thermodynamically stable and volatile hydrogen-halogen (HX, where X is a halogen) by-products. This is accomplished by selecting the first and second precursors such that only one of the first and second precursors contains a halogen. According to one embodiment of the invention, the first precursor contains a silicon-hydrogen compound but not a halogen and the second precursor contains a silicon-halogen-compound or a halogenated dopant. The exposure can be carried out for a time period that saturates a reaction of the first and second precursors on the substrate 500 and forms the silicon or silicon-containing film 506 and a volatile HX by-product.

The silicon-hydrogen compound can contain silane ($SiH_4$), disilane ($Si_2H_6$), or a combination thereof. The silicon-halogen compound can contain a halogenated silane or a halogenated disilane. The halogenated silane and halogenated disilane can contain $SiCl_4$, $SiHCl_3$, $SiH_2Cl_2$, $SiH_3Cl$, $Si_2Cl_6$, $SiF_4$, $SiHF_3$, $SiH_2F_2$, $SiH_3F$, or $Si_2F_6$, or a combination of two or more thereof. The halogenated dopant can contain phosphor (P), boron (B), arsenic (As), carbon (C), or germanium, or a combination of two or more thereof. The halogenated dopant can include $PCl_5$, $PCl_5$, $PF_3$, $PF_5$, $PBr_3$, $PBr_5$, $BCl_3$, $BF_3$, $CCl_4$, or $GeCl_4$, or a combination of two or more thereof.

According to another embodiment of the invention, the first precursor contains a silicon-halogen compound and the second precursor contains a silicon-hydrogen compound but not a halogen or a dopant containing hydrogen but not a halogen. The silicon-halogen compound and the silicon-hydrogen compound not containing a halogen may be selected from the precursors described above. The dopant containing hydrogen but not a halogen can contain phosphorus, boron, arsenic, carbon, or germanium, or a combination of two or more thereof. The dopant containing hydrogen but not a halogen can contain $PH_3$, $BH_3$, $B_2H_6$, $AsH_3$, a hydrocarbon (e.g., $CH_4$, $C_2H_4$), or $GeH_4$, or a combination of two or more thereof.

At 210, the second precursor and the HX by-products (e.g., HF, HCl) are evacuated or purged from the batch processing system. The purging may use an inert gas such as $N_2$ or a noble gas.

According to some embodiments of the invention, the silicon-containing film 506 may optionally be treated at 211. The optional treatment may be used to further reduce the amount of contaminants (e.g., a halogen) in the silicon or silicon-containing film 506. The optional treatment may be periodically performed after step 210, for example after each step 210 or less frequently, for example every second, third, or fourth, etc., time step 210 is performed. According to one embodiment of the invention, prior to the repeating, the silicon or silicon-containing film 506 may be plasma-treated with process gas 507 containing an inert gas, $H_2$ gas or a combination of an inert gas and $H_2$ gas. According to another embodiment, prior to the repeating, the silicon or silicon-containing film 506 may be treated with process gas 507 in the absence of a plasma with an inert gas, $H_2$ gas or a combination of an inert gas and $H_2$ gas.

At 212, the exposing and evacuation or purging steps 204-210 and optionally step 211 are repeated until the silicon or silicon-containing film 508 has a desired thickness. In some examples, the silicon or silicon-containing film 508 can have a thickness between 1 nm and 1000 nm, or between 10 nm and 100 nm. However other thicknesses are contemplated and may be used.

Figure 3:
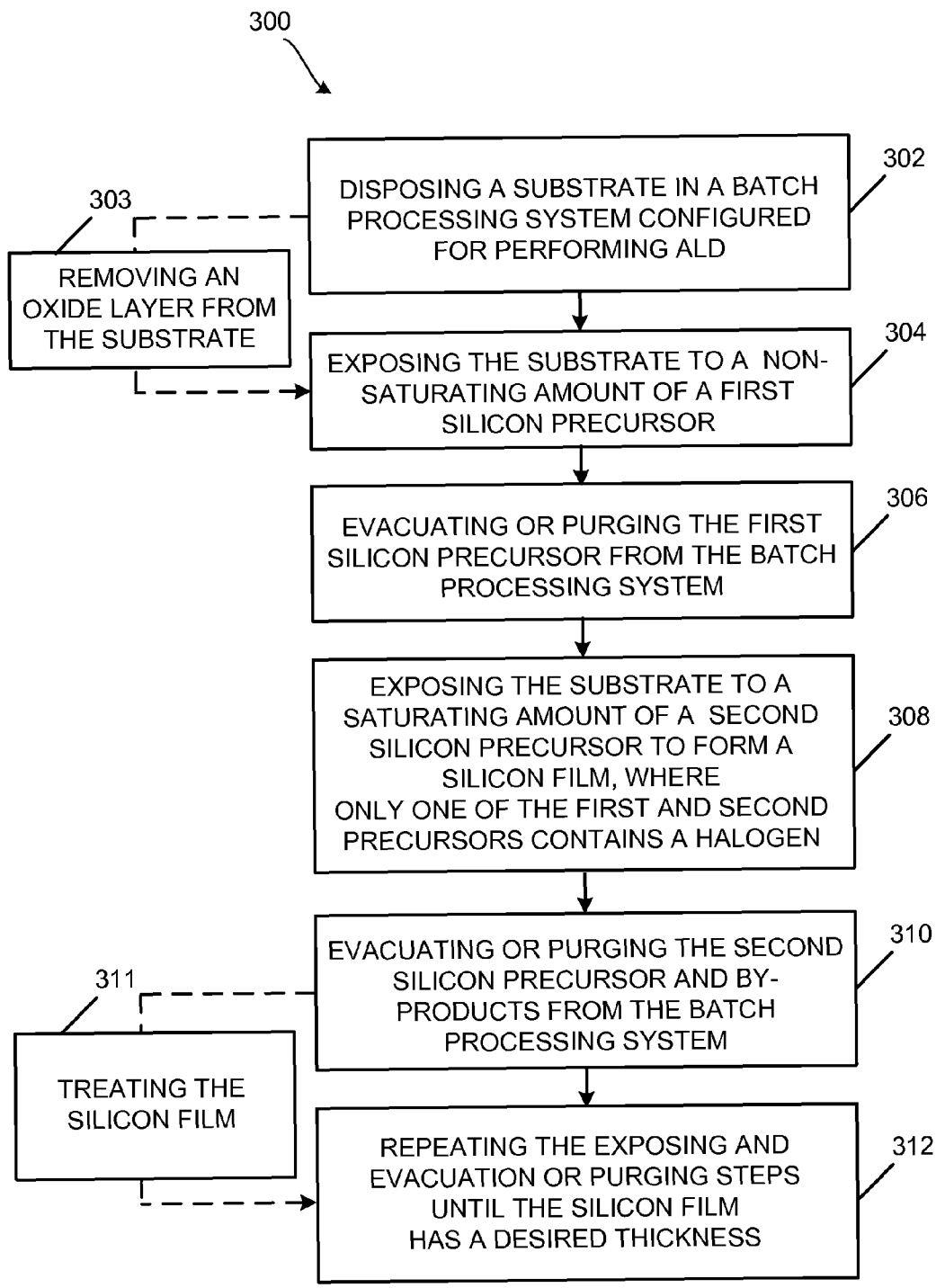
FIG. 3 is a flow diagram for forming a silicon film on a substrate by ALD according to another embodiment of the invention.

Referring now to FIGS. 3 and 5A-5F, FIG. 3 is a flow diagram for forming a silicon film on a substrate by ALD according to another embodiment of the invention. The flow diagram in FIG. 3 is similar to the flow diagram of FIG. 2, and in FIG. 3, the process 300 starts at 302. At 302, a substrate 500 is provided in a process chamber of a batch processing system. The process chamber can, for example, be the process chamber 10 of the batch processing system 1 depicted in FIG. 1. The substrate 500 can, for example, contain Si, SiGe, SiGeC, SiC, SiN, SiCN, SiCO, Ge, can be a glass substrate, a LCD substrate, or a compound semiconductor substrate, and can include numerous active devices and/or isolation regions. Furthermore, the substrate can be a patterned substrate and contain vias or trenches or combinations thereof.

At 303, an oxide layer 502 may be removed from the substrate 500.

At 304, substrate 500 is exposed to a non-saturating amount of a first silicon precursor. The exposure can be carried out for a time period that forms a non-saturated layer 504 of the first precursor or fragments of the first precursor on the substrate 500.

At 306, the first silicon precursor is evacuated or purged from the batch processing system. The purging may use an inert gas such as $N_2$ or a noble gas.

At 308, the substrate 500 is exposed to a saturating amount of a second silicon precursor to form a silicon film 506. The exposure to the second silicon precursor saturates the non-saturated layer 504 and forms the silicon film 506. In some examples, the silicon containing film 506 may contain fragments of the second silicon precursor. For example, the silicon film 506 may be a poly-Si film or an epitaxial silicon film. According to embodiments of the invention, the deposition of a silicon film 506 at low temperature by ALD is enabled by formation of thermodynamically stable and volatile hydrogen-halogen (HX) (HX) by-products. This is accomplished by selecting the first and second silicon precursors such that only one of the first and second silicon precursors contains a halogen.

According to one embodiment of the invention, the first silicon precursor contains a silicon-hydrogen compound but not a halogen and the second precursor contains a silicon-halogen compound. The exposure can be carried out for a time period that saturates a reaction of the first and second silicon precursors on the substrate 500 and forms the silicon 506 and a volatile HX by-product.

The silicon-hydrogen compound can contain silane ($SiH_4$), disilane ($Si_2H_6$), or a combination thereof. The silicon-halogen-compound can contain a halogenated silane or a halogenated disilane. The halogenated silane or halogenated disilane can contain $SiCl_4$, $SiHCl_3$, $SiH_2Cl_2$, $SiH_3Cl$, $Si_2Cl_6$, $SiF_4$, $SiHF_3$, $SiH_2F_2$, $SiH_3F$, or $Si_2F_6$, or a combination of two or more thereof.

According to another embodiment of the invention, the first silicon precursor contains a silicon-halogen compound and the second silicon precursor contains a silicon-hydrogen compound but not a halogen. The silicon-halogen compound and the silicon-hydrogen compound not containing a halogen may be selected from the precursors described above.

At 310, the second silicon precursor and the HX by-products are evacuated or purged from the batch processing system. The purging may use an inert gas such as $N_2$ or a noble gas.

The inventors have realized that the separate exposures of the non-saturating amount of the first silicon precursor at 304 and the saturating amount of the second silicon precursor at 308 allows for independently controlling the ratio of halogen to hydrogen on the substrate 500. This can be utilized to maximize halogen removal from the silicon-containing film 506 in the form of the volatile HX by-products and thereby reduce halogen content of the silicon film 506.

According to some embodiments of the invention, the silicon film 506 may optionally be treated at 311 with a cleaning gas. The optional treatment may be used to further reduce the amount of contaminants (e.g., a halogen) in the silicon film 506. The optional treatment may be periodically performed after step 310, for example after each step 310 or less frequently, for example every second, third, or fourth, etc., time step 210 is performed. According to one embodiment of the invention, prior to the repeating, the silicon film 506 may be plasma-treated with cleaning gas 507 containing an inert gas, $H_2$ gas, or a combination of an inert gas and $H_2$ gas. According to another embodiment, prior to the repeating, the silicon film 506 may be treated with cleaning gas 507 in the absence of a plasma with an inert gas, $H_2$ gas, or a combination of an inert gas and $H_2$ gas.

At 312, the exposing and evacuation or purging steps 304-310 and optionally step 311 are repeated until the silicon film 508 has a desired thickness. In some examples, the silicon film 508 can have a thickness between 1 nm and 1000 nm, or between 10 nm and 100 nm. However, other thicknesses are contemplated and may be used.

According to another embodiment, a method is provided for depositing a silicon or silicon-containing film. The method includes disposing the substrate in a batch processing system configured for performing ALD of the silicon or silicon-containing film, exposing the substrate to a saturating amount of a first precursor containing silicon, evacuating or purging the first precursor from the batch processing system. The method further includes exposing the substrate to a saturating amount of a second precursor containing silicon or a dopant, where only one of the first and second precursors contain a halogen, and a reaction of the first and second precursors on the substrate forms the silicon or silicon-containing film and a volatile hydrogen-halogen (HX) by-product, evacuating or purging the second precursor and the hydrogen-halogen (HX) by-product from the batch processing system, repeating the exposing and evacuation or purging steps until the silicon or silicon-containing film has a desired thickness, and periodically treating the silicon-containing film with a cleaning gas prior to the repeating.

Figure 4:
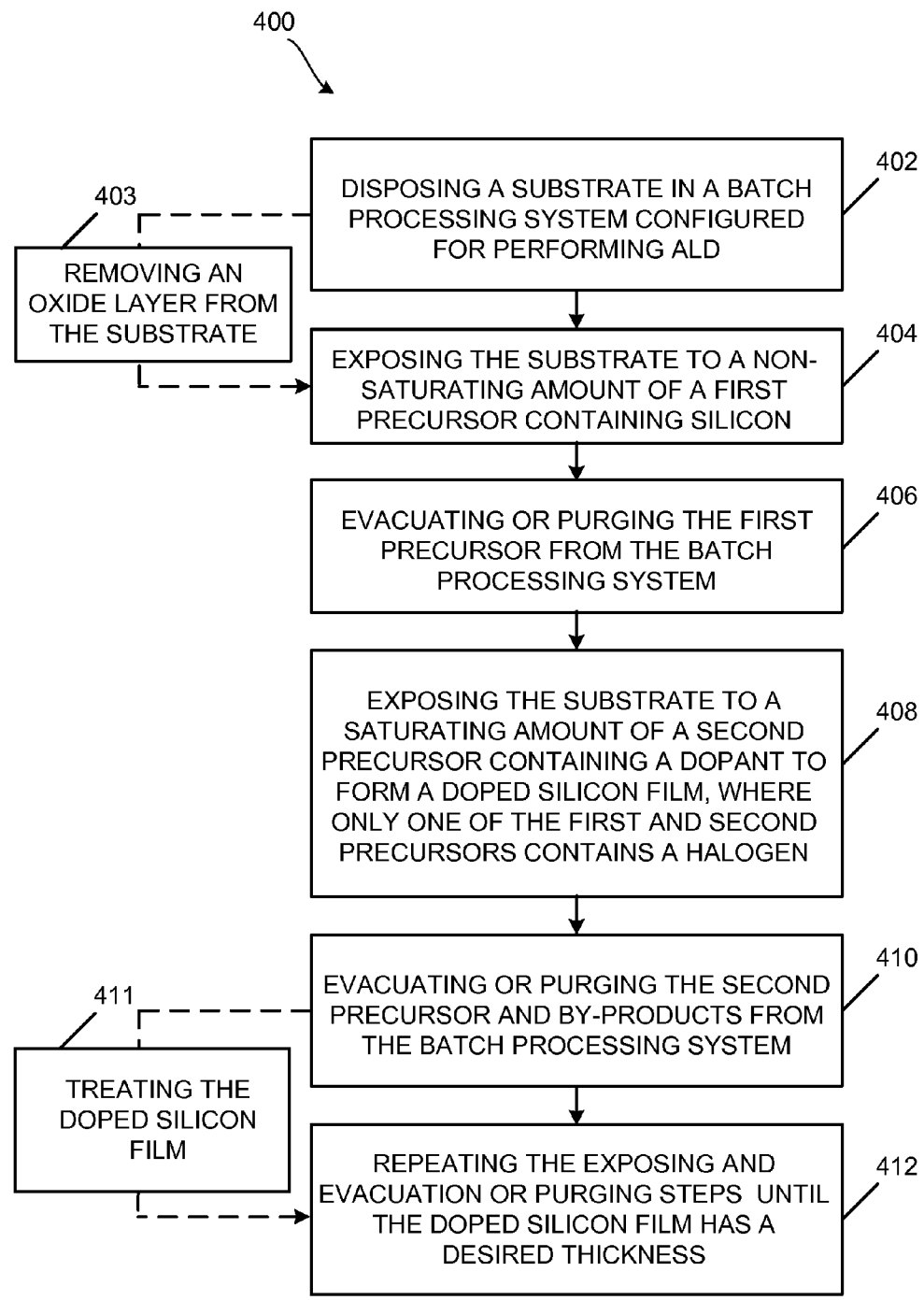
FIG. 4 is a flow diagram for forming a silicon-containing film on a substrate by ALD according to yet another embodiment of the invention.

Referring now to FIGS. 4 and 5A-5F, FIG. 4 is a flow diagram for forming a doped silicon film on a substrate by ALD according to an embodiment of the invention. The flow diagram in FIG. 4 is similar to the flow diagram of FIG. 2, and in FIG. 4, the process 400 starts at 402. At 402, a substrate 500 is provided in a process chamber of a batch processing system. The process chamber can, for example, be the process chamber 10 of the batch processing system 1 depicted in FIG. 1. The substrate 500 can, for example, contain Si, SiGe, SiGeC, SiC, SiN, SiCN, SiCO, Ge, can be a glass substrate, a LCD substrate, or a compound semiconductor substrate, and can include numerous active devices and/or isolation regions. Furthermore, the substrate 500 can be a patterned substrate and contain vias or trenches or combinations thereof.

At 403, an oxide layer 502 may be removed from the substrate 500.

At 404, substrate 500 is exposed to a non-saturating amount of a first precursor containing silicon. The exposure can be carried out for a time period that forms a non-saturated layer 504 of the first precursor or fragments of the first precursor on the substrate 500. The non-saturating exposure can be less than 90, 80, 70, 60, 50, 40, 30, 20, or even than 10% of a saturating exposure of the first precursor containing silicon.

At 406, the first precursor is evacuated or purged from the batch processing system. The purging may use an inert gas such as $N_2$ or a noble gas.

At 408, the substrate 500 is exposed to a saturating amount of a second precursor containing a dopant to form doped silicon film 506. The exposure to the second precursor saturates the non-saturated layer 504 and forms the doped silicon film 506. In some examples, the doped silicon film 506 may contain fragments of the second precursor. According to embodiments of the invention, the deposition of a doped silicon film 506 at low temperature by ALD is enabled by formation of thermodynamically stable and volatile HX by-products. This is accomplished by selecting the first and second precursors such that only one of the first and second precursors contains a halogen. According to one embodiment of the invention, the first precursor contains a silicon-hydrogen compound but not a halogen and the second precursor contains a halogenated dopant. The exposure can be carried out for a time period that saturates a reaction of the first and second precursors on the substrate 500 and forms the doped silicon film and a volatile HX by-product.

According to another embodiment of the invention, the first precursor contains a silicon-halogen compound and the second precursor contains a dopant containing hydrogen but not a halogen.

The silicon-hydrogen compound can contain silane ($SiH_4$), disilane ($Si_2H_6$), or a combination thereof. The silicon-halogen-compound can contain a halogenated silane or a halogenated disilane. The halogenated silane or halogenated disilane can contain $SiCl_4$, $SiHCl_3$, $SiH_2Cl_2$, $SiH_3Cl$, $Si_2Cl_6$, $SiF_4$, $SiHF_3$, $SiH_2F_2$, $SiH_3F$, or $Si_2F_6$, or a combination of two or more thereof. The halogenated dopant can contain phosphor, boron, arsenic, carbon, or germanium, or a combination of two or more thereof. The halogenated dopant can include $PCl_3$, $PCl_5$, $PF_3$, $PF_5$, $PBr_3$, $PBr_5$, $BCl_3$, $BF_3$, $CCl_4$, or $GeCl_4$, or a combination of two or more thereof. The dopant containing hydrogen but not a halogen can contain phosphorus, boron, arsenic, carbon, or germanium, or a combination of two or more thereof. The dopant containing hydrogen but not a halogen can contain $PH_3$, $BH_3$, $B_2H_6$, $AsH_3$, a hydrocarbon (e.g., $CH_4$, $C_2H_4$), or $GeH_4$, or a combination of two or more thereof.

The inventors have realized that the separate exposures of the first precursor containing silicon at 404 and the second precursor containing a dopant at 308 allow for independently controlling the ratio of halogen to hydrogen on the substrate 500. This can be utilized to maximize halogen removal from the silicon-containing film 506 in the form of volatile HX by-products and thereby reduce halogen content of the doped silicon film 506. Furthermore, the separate exposures may be utilized for controlling the ratio of silicon to the dopant and therefore the doping level of the doped silicon film.

At 410, the second precursor and the HX by-products (e.g., HF, HCl) are evacuated or purged from the batch processing system. The purging may use an inert gas such as $N_2$ or a noble gas.

According to some embodiments of the invention, the silicon-containing film 506 may optionally be treated at 411. The optional treatment may be used to further reduce the amount of contaminants (e.g., a halogen) in the silicon-containing film 506. The optional treatment may be performed after step 410, or less frequently, for example every second, third, or fourth, etc., time step 310 is performed. According to one embodiment of the invention, prior to the repeating, the silicon-containing film 506 may be plasma-treated with process gas 507 containing an inert gas, $H_2$ gas, or a combination of an inert gas and $H_2$ gas. According to another embodiment, prior to the repeating, the silicon-containing film 506 may be treated with cleaning gas 507 in the absence of a plasma with an inert gas, $H_2$ gas, or a combination of an inert gas and $H_2$ gas.

At 412, the exposing and evacuation or purging steps are repeated until the silicon-containing film 508 has a desired thickness. In some examples, the silicon-containing film 508 can have a thickness between 1 nm and 1000 nm, or between 10 nm and 100 nm. However, other thicknesses are contemplated and may be used.

A plurality of embodiments for depositing silicon and silicon-containing films by ALD has been disclosed. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. For example, the term "on" as used herein (including in the claims) does not require that a film "on" a patterned structure is directly on and in immediate contact with the substrate; there may be a second film or other structure between the film and the patterned structure.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method for depositing a silicon-containing film on a substrate, comprising:
disposing the substrate in a batch processing system configured for performing atomic layer deposition (ALD) of the silicon-containing film;

exposing the substrate to a non-saturating amount of a first precursor containing silicon;

evacuating or purging the first precursor from the batch processing system;

exposing the substrate to a saturating amount of a second precursor containing silicon or a dopant, wherein only one of the first and second precursors contains a halogen, and a reaction of the first and second precursors on the substrate forms the silicon-containing film and a volatile hydrogen-halogen (HX) by-product;

evacuating or purging the second precursor and the HX by-product from the batch processing system; and repeating the exposing and evacuation or purging steps until the silicon-containing film has a desired thickness.

2. The method of claim 1, wherein the first precursor contains a silicon-hydrogen compound but not a halogen and the second precursor contains a silicon-halogen-compound or a halogenated dopant, or the first precursor contains a silicon-halogen-compound and the second precursor contains a silicon-hydrogen compound but not a halogen or a dopant containing hydrogen but not a halogen.

3. The method of claim 2, wherein the silicon-hydrogen compound contains silane ($SiH_4$), disilane ($Si_2H_6$), or a combination thereof.

4. The method of claim 2, wherein the silicon-halogen-compound contains a halogenated silane or a halogenated disilane.

5. The method of claim 4, wherein the halogenated silane or halogenated disilane comprises $SiCl_4$, $SiHCl_3$, $SiH_2Cl_2$, $SiH_3Cl$, $Si_2Cl_6$, $SiF_4$, $SiHF_3$, $SiH_2F_2$, $SiH_3F$, or $Si_2F_6$, or a combination of two or more thereof.

6. The method of claim 2, wherein the halogenated dopant comprises phosphor, boron, arsenic, or germanium, or a combination of two or more thereof.

7. The method of claim 6, wherein the halogenated dopant comprises $PCl_3$, $PCl_5$, $PF_3$, $PF_5$, $PBr_3$, $PBr_5$, $BCl_3$, $BF_3$, or $GeCl_4$, or a combination of two or more thereof.

8. The method of claim 2, wherein the dopant containing hydrogen but not a halogen comprises phosphorus, boron, arsenic, or germanium, or a combination of two or more thereof.

9. The method of claim 8, wherein the dopant containing hydrogen but not a halogen comprises $PH_3$, $BH_3$, $B_2H_6$, $AsH_3$, a hydrocarbon, or $GeH_4$, or a combination of two or more thereof.

10. The method of claim 1, further comprising:
prior to the repeating, periodically plasma-treating the silicon-containing film with an inert gas, $H_2$ gas or a combination of an inert gas and $H_2$ gas.

11. The method of claim 1, further comprising:
prior to the repeating, periodically treating the silicon-containing film in the absence of a plasma with an inert gas, $H_2$ gas or a combination of an inert gas and $H_2$ gas.

12. The method of claim 1, wherein the silicon-containing film is a silicon film.

13. A method for depositing a silicon-containing film on a substrate, comprising:
disposing the substrate in a batch processing system configured for performing atomic layer deposition (ALD) of the silicon-containing film;

exposing the substrate to a non-saturating amount of a first silicon precursor;

evacuating or purging the first silicon precursor from the batch processing system;

exposing the substrate to a saturating amount of a second silicon precursor, wherein only one of the first and second silicon precursors contains a halogen, and a reaction of the first and second silicon precursors on the substrate forms the silicon-containing film and a volatile hydrogen-halogen (HX) by-product;

evacuating or purging the second silicon precursor and the HX by-product from the batch processing system; and repeating the exposing and evacuation or purging steps until the silicon film has a desired thickness; and prior to the repeating, periodically treating the silicon-containing film with an inert gas, $H_2$ gas, or a combination of an inert gas and $H_2$ gas.

14. The method of claim 13, wherein the first silicon precursor contains a silicon-hydrogen compound but not a halogen and the second silicon precursor contains a silicon-halogen-compound, or the first precursor contains a silicon-halogen-compound and the second precursor contains a silicon-hydrogen compound but not a halogen.

15. The method of claim 14, wherein the silicon-hydrogen compound contains silane ($SiH_4$), disilane ($Si_2H_6$), or a combination thereof.

16. The method of claim 14, wherein the silicon-halogen-compound contains a halogenated silane or a halogenated disilane comprising $SiCl_4$, $SiHCl_3$, $SiH_2Cl_2$, $SiH_3Cl$, $Si_2Cl_6$, $SiF_4$, $SiHF_3$, $SiH_2F_2$, $SiH_3F$, or $Si_2F_6$, or a combination of two or more thereof.

17. The method of claim 13, wherein the treating comprises periodically plasma-treating the silicon-containing film with an inert gas, $H_2$ gas, or a combination of an inert gas and $H_2$ gas.

18. The method of claim 13, wherein the treating comprises
periodically treating the silicon-containing film in the absence of a plasma with an inert gas, $H_2$ gas, or a combination of an inert gas and $H_2$ gas.

19. A method for depositing a doped silicon film on a substrate, comprising:
disposing the substrate in a batch processing system configured for performing atomic layer deposition (ALD) of the doped silicon film;

exposing the substrate to a non-saturating amount of a first precursor containing silicon;

evacuating or purging the first precursor from the batch processing system;

exposing the substrate to a saturating amount of a second precursor containing a dopant, wherein only one of the first and second precursors contains a halogen, and a reaction of the first and second precursors on the substrate forms the doped silicon film and a volatile hydrogen-halogen (HX) by-product;

evacuating or purging the second precursor and the HX by-product from the batch processing system; and repeating the exposing and evacuation or purging steps until the doped silicon film has a desired thickness.

20. The method of claim 19, wherein the first precursor contains a silicon-hydrogen compound but not a halogen and the second precursor contains a halogenated dopant, or the first precursor contains a silicon-halogen-compound and the second precursor contains a dopant containing hydrogen but not a halogen.

21. The method of claim 20, wherein the silicon-hydrogen compound contains silane ($SiH_4$), disilane ($Si_2H_6$), or a combination thereof.

22. The method of claim 20, wherein the silicon-halogen-compound contains a halogenated silane or a halogenated disilaned comprising $SiCl_4$, $SiHCl_3$, $SiH_2Cl_2$, $SiH_3Cl$, $Si_2Cl_6$, $SiF_4$, $SiHF_3$, $SiH_2F_2$, $SiH_3F$, or $Si_2F_6$, or a combination of two or more thereof.

23. The method of claim 20, wherein the halogenated dopant comprises $PCl_3$, $PCl_5$, $PF_3$, $PF_5$, $PBr_3$, $PBr_5$, $BCl_3$, $BF_3$, $CCl_4$, or $GeCl_4$, or a combination of two or more thereof.

24. The method of claim 20, wherein the dopant containing hydrogen but not a halogen comprises $PH_3$, $BH_3$, $B_2H_6$, $AsH_3$, a hydrocarbon, or $GeH_4$, or a combination of two or more thereof.

25. The method of claim 19, further comprising:
prior to the repeating, periodically plasma-treating the doped silicon film with an inert gas, $H_2$ gas, or a combination of an inert gas and $H_2$ gas.

26. The method of claim 19, further comprising:
prior to the repeating, periodically treating the doped silicon film in the absence of a plasma with an inert gas, $H_2$ gas, or a combination of an inert gas and $H_2$ gas.

* * * * *

UNITED STATES PATENT AND TRADEMARK OFFICE
CERTIFICATE OF CORRECTION

PATENT NO.        : 8,012,859 B1
APPLICATION NO.   : 12/751774
DATED             : September 6, 2011
INVENTOR(S)       : Joe et al.

Page 1 of 1

It is certified that error appears in the above-identified patent and that said Letters Patent is hereby corrected as shown below:

Col. 12, line 7, "silicon film" should read --silicon-containing film--.
Col. 12, line 14, "first precursor" should read --first silicon precursor--.
Col. 12, line 15, "second precursor" should read --second silicon precursor--.

Signed and Sealed this
Eighth Day of November, 2011

David J. Kappos
*Director of the United States Patent and Trademark Office*